(12) United States Patent
Dhaoui et al.

(10) Patent No.: US 7,368,789 B1
(45) Date of Patent: May 6, 2008

(54) NON-VOLATILE PROGRAMMABLE MEMORY CELL AND ARRAY FOR PROGRAMMABLE LOGIC ARRAY

(75) Inventors: Fethi Dhaoui, Patterson, CA (US); John McCollum, Saratoga, CA (US); Frank Hawley, Campbell, CA (US); Leslie Richard Wilkinson, Cave Junction, OR (US)

(73) Assignee: Actel Corporation, Mountain View, CA (US)

( * ) Notice: Subject to any disclaimer, the term of this patent is extended or adjusted under 35 U.S.C. 154(b) by 208 days.

(21) Appl. No.: 11/152,018

(22) Filed: Jun. 13, 2005

(51) Int. Cl.
*H01L 29/76* (2006.01)
(52) U.S. Cl. ...................... 257/369; 257/314
(58) Field of Classification Search ............... 257/369, 257/314
See application file for complete search history.

(56) References Cited

U.S. PATENT DOCUMENTS

| | | | |
|---|---|---|---|
| 5,640,344 A | 6/1997 | Pani et al. | 365/182 |
| 5,740,106 A | 4/1998 | Nazarian | 365/185.1 |
| 5,847,993 A | 12/1998 | Dejenfelt | 365/185.1 |
| 6,144,580 A | 11/2000 | Murray | 365/185.01 |
| 6,356,478 B1 | 3/2002 | McCollum | 365/185.01 |

*Primary Examiner*—Long Pham
(74) *Attorney, Agent, or Firm*—Sierra Patent Group, Ltd.

(57) ABSTRACT

A non-volatile programmable memory cell suitable for use in a programmable logic array includes a non-volatile MOS transistor of a first conductivity type in series with a volatile MOS transistor of a second conductivity type. The non-volatile MOS transistor may be a floating gate transistor, such as a flash transistor, or may be another type of non-volatile transistor such as a floating charge-trapping SONOS, MONOS transistor, or a nano-crystal transistor. A volatile MOS transistor, an inverter, or a buffer may be driven by coupling its gate or input to the common connection between the non-volatile MOS transistor and the volatile MOS transistor.

18 Claims, 6 Drawing Sheets

NON-VOLATILE PROGRAMMABLE MEMORY CELL AND ARRAY FOR PROGRAMMABLE LOGIC ARRAY

BACKGROUND OF THE INVENTION

1. Field of the Invention

The present invention relates to non-volatile-memory based programmable logic devices. More particularly, the present invention pertains to memory cells for use in non-volatile-memory based programmable logic devices such as field-programmable-gate-array (FPGA) devices.

2. The Prior Art

Numerous non-volatile memory cells have been proposed for use in programmable logic devices such as FPGAs. As non-exhaustive examples, U.S. Pat. No. 6,144,580 discloses embodiments where p-channel and n-channel non-volatile MOS transistors are connected in series and have different control gate connection arrangements. U.S. Pat. No. 6,356,478 discloses p-channel and n-channel non-volatile MOS transistors sharing a common floating gate and a common control gate. U.S. Pat. No. 5,740,106 discloses several different variations on p-channel and n-channel non-volatile MOS transistors connected in series. Some share common floating gates. U.S. Pat. No. 5,847,993 discloses several different variations on p-channel and n-channel volatile and non-volatile MOS transistors connected in series. Some share common floating gates. U.S. Pat. No. 5,640,344 discloses p-channel and n-channel non-volatile MOS transistors sharing a common floating gate and a common control gate.

In addition, as geometries shrink for user-programmable devices such as FPGAs, so do the maximum voltages that the transistors used to build these devices can withstand. This presents a problem in that the voltages used to program and erase non-volatile memory transistors are not decreasing as fast as the voltages that are used to operate the transistors from which the logic is configured. In order to take advantage of the ever decreasing logic-transistor geometries, the logic circuitry needs to be protected from the programming and erase potentials that are encountered in the FPGA programming circuitry.

BRIEF DESCRIPTION OF THE INVENTION

A non-volatile programmable memory cell is formed in a semiconductor substrate. A non-volatile MOS transistor is formed in a first semiconductor region and coupled between a first power supply potential and an output node. A volatile MOS transistor is formed in a second semiconductor region and is coupled between the output node and a second power supply potential. A volatile MOS switch transistor is formed in a third semiconductor region and is coupled to the output node. The substrate, volatile MOS transistor, first semiconductor region, and the third semiconductor region are of a first conductivity type. The non-volatile MOS transistor, volatile MOS switch transistor and second semiconductor regions are of a second conductivity type. The first and third semiconductor regions are isolated from one another.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

A non-volatile programmable memory cell suitable for use in a programmable logic array includes a non-volatile MOS transistor in series with a volatile MOS transistor. The non-volatile MOS transistor may be a floating gate transistor, such as a flash transistor, or may be another type of non-volatile transistor such as a floating charge-trapping SONOS, MONOS transistor, or a nano-crystal transistor. A switch that may comprise a volatile MOS transistor, an inverter, or a buffer may be driven by coupling its gate or input to the common connection between the non-volatile MOS transistor and the volatile MOS transistor. The non-volatile MOS transistor and the switch are isolated from one another by forming the non-volatile MOS transistor in a first well and forming the switch in a second well isolated from the first well.

According to one aspect of the invention, a non-volatile n-channel MOS pulldown transistor is formed in an inner p-well in a triple well structure. The drain of the non-volatile n-channel MOS pulldown transistor is connected to the drain of a p-channel MOS pullup transistor formed in the n-well containing the inner p-well. An n-channel MOS switch transistor is formed in the p-type substrate containing the n-well has its gate coupled to the common drain connection of the non-volatile n-channel MOS pulldown transistor and the p-channel MOS pullup transistor. In a variation of this arrangement, an inverter or buffer may have its input coupled to the common drain connection of the non-volatile n-channel MOS pulldown transistor and the p-channel MOS pullup transistor.

According to another aspect of the invention, a non-volatile p-channel MOS pullup transistor formed in an n-well on a p-type substrate. The drain of the non-volatile p-channel MOS pullup transistor is connected to the drain of an n-channel MOS pulldown transistor formed in an inner p-well contained within the n-well. An n-channel MOS switch transistor formed in the p-type substrate and has its gate coupled to the common drain connection of the non-volatile p-channel MOS pullup transistor and the n-channel MOS pulldown transistor. In a variation of this arrangement, an inverter or buffer may have its input coupled to the common drain connection of the non-volatile p-channel MOS pullup transistor and the n-channel MOS pulldown transistor.

Referring first to FIGS. 1A through 1D, schematic diagrams show several non-volatile memory cells according to the present invention in which a non-volatile MOS pulldown transistor is used in conjunction with a volatile pullup transistor. The combination of the non-volatile device and the volatile device are used to drive a switch.

Figure 1A:
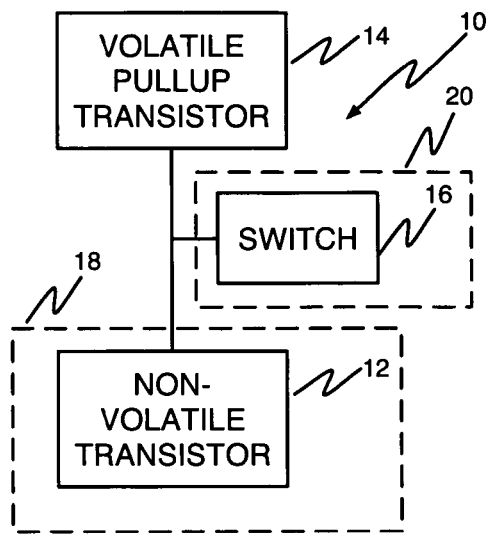
FIGS. 1A through 1D are schematic diagrams illustrating various non-volatile programmable memory cells using n-channel non-volatile MOS transistors, volatile p-channel MOS pullup transistors and n-channel transistors as switches.

First, in FIG. 1A, memory cell 10 is shown. Reference numeral 12 represents a non-volatile pulldown device, reference numeral 14 represents a volatile pullup device. Reference numeral 16 represents a switch controlled by the devices 12 and 14 that may be used to control circuitry or selectively make interconnects. As presently contemplated, switch 16 may comprise a single transistor, an inverter, a buffer (two inverters in series) or other device. Switch 16 may even be itself the input of a multiplexer.

The non-volatile pulldown device is disposed in a first well 18. The volatile switch device is disposed in a second well 20 that is separated from and thus electrically isolated from the first p-well 18.

Figure 1B:
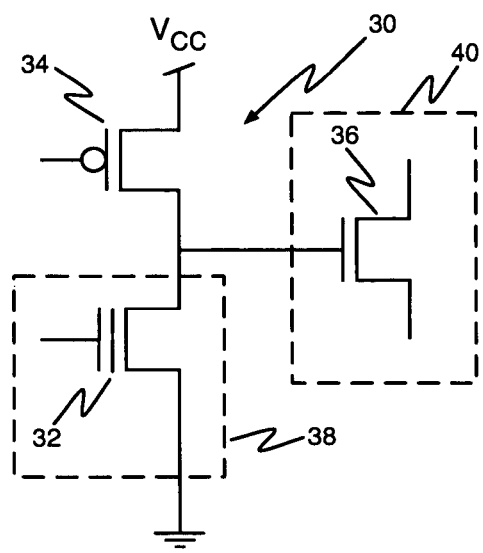

Referring now to FIG. 1B, memory cell 30 is shown. N-channel floating-gate MOS transistor 32 has its source coupled to ground and its drain coupled to the drain of p-channel MOS pullup transistor 34. The source of p-channel pullup transistor 34 is coupled to the supply potential $V_{CC}$. The common drain connection of transistors 32 and 34 is coupled to the gate of n-channel switch transistor 36. The source and drain of n-channel MOS switch transistor 36 may be connected to provide programmable functions as will be disclosed herein.

The n-channel floating-gate MOS transistor 32 is disposed in a first p-well 38. The n-channel switch transistor 36 is disposed in a second p-well 40 that is separated from and thus electrically isolated from the first p-well 38.

N-channel floating-gate MOS transistor 32 may be a floating gate transistor as is known in the art. Its gate may be coupled to a circuit to provide the proper voltages for programming and erasing the memory cell 30, and for using the memory cell 30 during normal circuit operation. The particular potentials used for these operations will vary as a function of the technology employed and the process geometry.

Figure 1C:
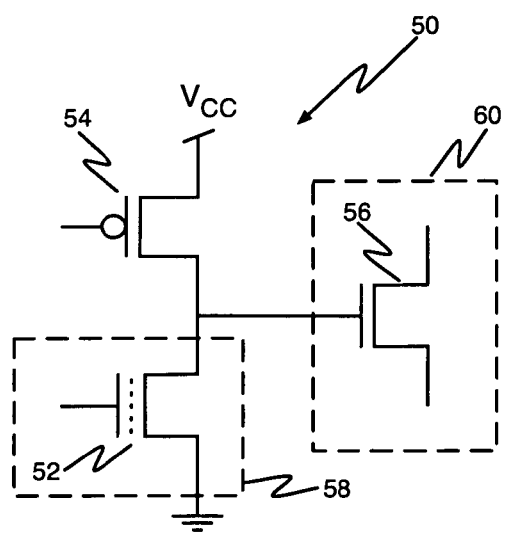

Referring now to FIG. 1C, memory cell 50 is shown. N-channel floating charge-trap MOS transistor 52 has its source coupled to ground and its drain coupled to the drain of p-channel MOS pullup transistor 54. The source of p-channel pullup transistor 54 is coupled to the supply potential $V_{CC}$. The common drain connection of transistors 52 and 54 is coupled to the gate of n-channel switch transistor 56. The source and drain of n-channel MOS switch transistor 56 may be connected to provide programmable functions as will be disclosed herein.

The n-channel floating charge trap MOS transistor 52 is disposed in a first p-well 58. The n-channel switch transistor 56 is disposed in a second p-well 60 that is separated from and thus isolated from the first p-well 58.

N-channel floating charge-trap MOS transistor 52 may be fabricated using MNOS, SONOS, and other charge-trapping structures. Its gate may be coupled to a circuit to provide the proper voltages for programming and erasing the memory cell 30, and for using the memory cell 50 during normal circuit operation. The particular potentials used for these operations will vary as a function of the technology employed and the process geometry. As an example, where a high-voltage p-channel MOS pullup transistor 54 is used, the following illustrative potentials may be encountered:

|  | N-Channel | | | P-Channel | | | |
| --- | --- | --- | --- | --- | --- | --- | --- |
|  | $V_G$ | $V_D$ | $V_S$ | $V_B$ | $V_G$ | $V_S$ | $V_{NW}$ |
| Program | 7 V | 3.5 V | 0 V | 0 V | −3.5 V | 0 V | 1 V |
| Erase | −7 V | 7 V | 7 V | 7 V | 3.5 V | 7 V | 7 V |
| Normal Operation | 2.5 V | 0 V | 2.5 V/0 V | 0 V | 3 V | 2.5 V/0 V | 2.5 V |

Discrete charge trapping devices are less vulnerable to tunnel oxide defects than are floating gate devices and their use may be preferable because of this characteristic.

Figure 1D:
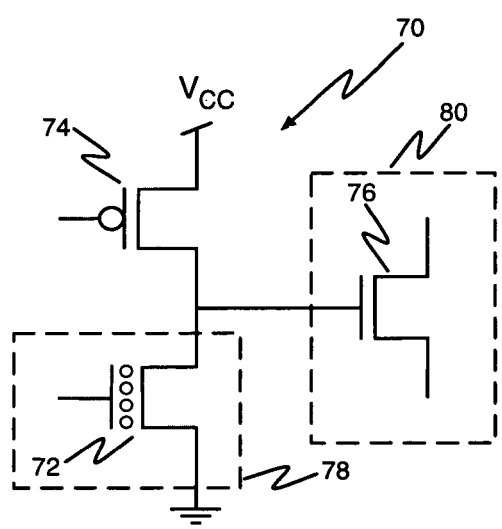

Referring now to FIG. 1D, memory cell 70 is shown. N-channel nano-crystal MOS transistor 72 has its source coupled to ground and its drain coupled to the drain of p-channel MOS pullup transistor 74. The source of p-channel pullup transistor 74 is coupled to the supply potential $V_{CC}$. The common drain connection of transistors 72 and 74 is coupled to the gate of n-channel switch transistor 76. The source and drain of n-channel MOS switch transistor 76 may be connected to provide programmable functions as will be disclosed herein.

The n-channel nano-crystal MOS transistor 72 is disposed in a first p-well 78. The n-channel switch transistor 76 is disposed in a second p-well 80 that is separated from and thus isolated from the first p-well 78.

N-channel nano-crystal MOS transistor 72 may be fabricated using known nano-crystal processing techniques. Its gate may be coupled to a circuit to provide the proper voltages for programming and erasing the memory cell 70, and for using the memory cell 70 during normal circuit operation. The particular potentials used for these operations will vary as a function of the technology employed and the process geometry.

In all of the cells shown in FIGS. 1A through 1D, the volatile p-channel MOS transistor charges the common drain connection of the p-channel and n-channel transistors, and thus the gate of the switching transistor, to $V_{CC}$ depending on whether or not the non-volatile transistor is programmed.

Persons of ordinary skill in the art will recognize that, while the switch devices used in the various embodiments of the present invention do not have to be high-voltage devices, their gates are connected to the drain diffusions of the non-volatile memory transistors in the memory cells. Hence, they must have gate oxide layers that are able to withstand the potentials that will be encountered during programming and erasing of the memory cells. The programming and erase potentials used will of course depend on the type of non-volatile technology used as well as the device geometries.

Figure 2A:
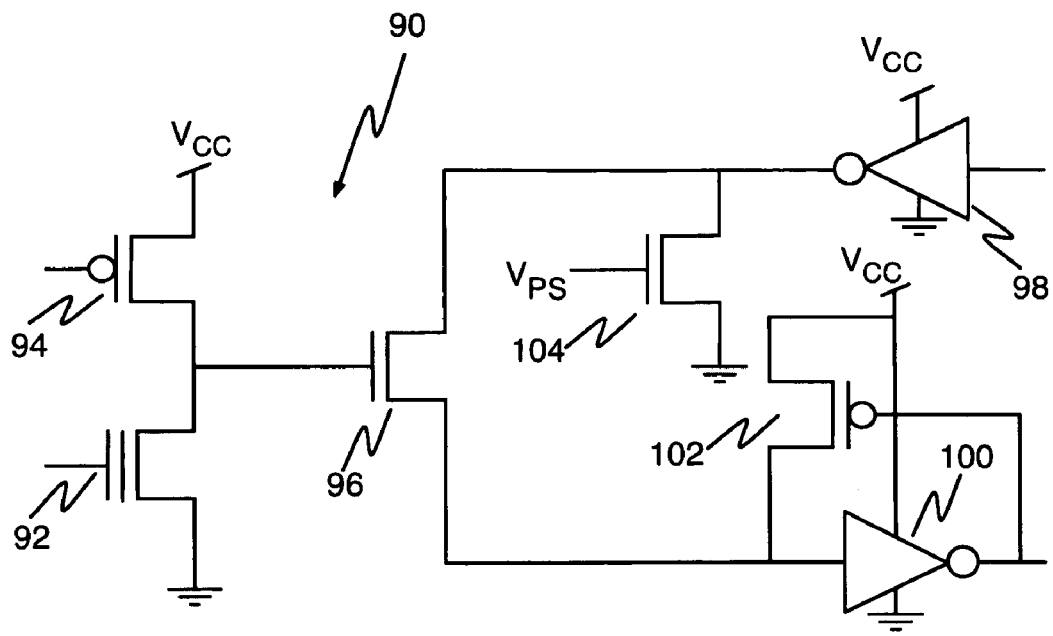
FIGS. 2A and 2B are schematic diagrams illustrating alternative ways to configure the non-volatile memory cells of the present invention in order to permit the use of low-voltage MOS devices therein.
Figure 2B:
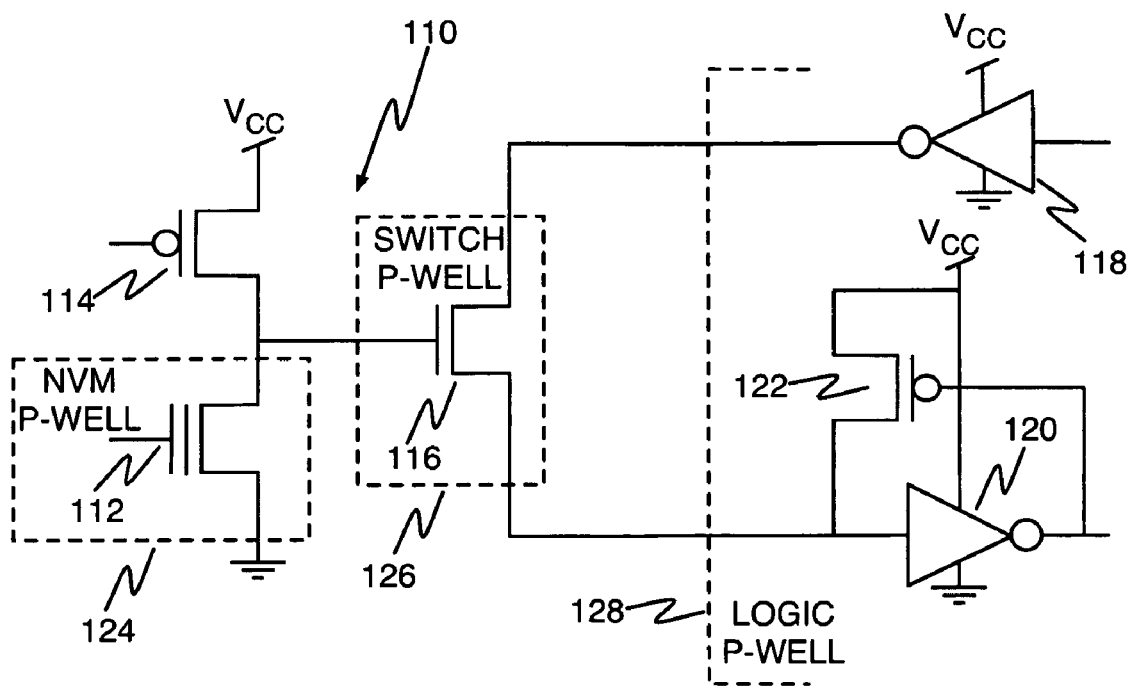

Referring now to FIGS. 2A and 2B, schematic diagrams illustrate alternative ways to configure the non-volatile memory cells of the present invention in order to permit the use of low-voltage volatile MOS devices therein.

FIG. 2A illustrates an implementation of a low-voltage embodiment of a non-volatile memory cell 90 like the one shown in FIG. 1B including a non-volatile n-channel MOS memory transistor 92 used as a pulldown device and a volatile p-channel MOS pullup transistor 94. Persons of ordinary skill in the art will appreciate that, while the non-volatile memory device is symbolized by a floating-gate transistor symbol, the other types of non-volatile memory devices disclosed herein will function equally well, the differences being a function of the programming and erase mechanisms associated with each different type of non-volatile device.

The drain of n-channel MOS switch transistor 96 is coupled to the output of inverter 98. Inverter 98 is a part of the logic circuitry inside the programmable logic integrated circuit. The source of n-channel MOS switch transistor 96 is coupled to the input of inverter 100. Inverter 100 is also a part of the logic circuitry inside the programmable logic integrated circuit. If n-channel MOS switch transistor 96 is turned on, the output of inverter 98 will be coupled to the input of inverter 100 to implement some logic circuit function.

P-channel MOS transistor 102 has its gate coupled to the output of inverter 100, its source coupled to the input of inverter 100 and its drain coupled to $V_{CC}$. P-channel MOS transistor 102 functions as a level restorer. If the output of inverter 98 is low, the input of inverter 100 is pulled low through n-channel MOS switch transistor 96 and output of inverter 100 will be high. In this case, p-channel MOS transistor 102 is turned off. If the output of inverter 98 is high, the input of inverter 100 is held high through n-channel MOS switch transistor 96 and the input of inverter 100 is high. P-channel MOS transistor 102 is turned on and the input of inverter 100 is pulled up to $V_{CC}$ through p-channel MOS transistor 102, compensating for any voltage drop across n-channel MOS switch transistor 96. This level-restore function will be useful if the voltage used to drive the gate of the n-channel MOS switch transistor 96 is driven by a voltage that does not exceed $V_{CC}$. In this case, as will be appreciated by persons of ordinary skill in the art, a $V_t$ drop will exist across n-channel MOS switch transistor 96 and the level-restore function will compensate for this drop. If, however, the gate of n-channel MOS switch transistor 96 is driven by a voltage that is at least one $V_t$ above $V_{CC}$, there will not be a $V_t$ drop across n-channel MOS switch transistor 96 and the level-restore function will not be necessary.

N-channel MOS preset transistor 104 has its drain coupled to the output of inverter 98 and its source coupled to ground. Its gate is coupled to a signal $V_{PS}$. The signal $V_{PS}$ is set to a $V_{CC}$ when the memory cell is being erased. This ties the output of inverter 98 to ground when the cell is being erased. During an erase operation, the n-channel MOS switch transistor 96 is turned on. This may lead to a leakage current from $V_{CC}$ to ground since the source and drain of the n-channel MOS switch transistor 96 are floating. Depending on the states of the inverters 98 and 100, which are connected via the n-channel MOS switch transistor 96, a $V_{CC}$ to ground short is very probable. This will lead to the collapse of the charge pump supplying the erase voltages. N-channel MOS preset transistor 104 (labeled $V_{PS}$ in FIG. 2A) prevents this from happening.

Referring now to FIG. 2B, another solution to the problem solved by the present invention is illustrated. Like the circuit of FIG. 2A, the circuit of FIG. 2B shows a non-volatile memory cell 110 like the one shown in FIG. 1B including a non-volatile n-channel MOS memory transistor 112 used as a pulldown device and a volatile p-channel MOS pullup transistor 114. Persons of ordinary skill in the art will appreciate that the various types of non-volatile memory devices disclosed herein may be used, the differences being a function of the programming and erase mechanisms associated with each different type of non-volatile device.

The drain of n-channel MOS switch transistor 116 is coupled to the output of inverter 118. Inverter 118 is a part of the logic circuitry inside the programmable logic integrated circuit. The source of n-channel MOS switch transistor 116 is coupled to the input of inverter 120. Inverter 120 is also a part of the logic circuitry inside the programmable logic integrated circuit. If n-channel MOS switch transistor 116 is turned on, the output of inverter 118 will be coupled to the input of inverter 110 to implement some logic circuit function. P-channel MOS transistor 122 functions as a level restorer in the same manner as does p-channel MOS transistor 102 in FIG. 2A.

Unlike the embodiment of FIG. 2A, non-volatile memory transistor 112 is formed in a p-well 124 separate from the p-well 126 in which n-channel MOS switch transistor 116 is formed. This isolation may be accomplished, for example, by placing the p-channel MOS pullup transistor 22, which is formed in an n-well, between the non-volatile memory transistor 112 and the volatile MOS switch transistor 116. The n-well of the p-channel MOS pullup transistor 22 may also separate the p-well 126 from the p-well (or substrate) 128 in which the n-channel MOS transistors in the logic circuits of the integrated circuit are formed. By placing the n-channel MOS switch transistor 116 in an isolated p-well 126 rather than the substrate and biasing the p-well 126 to $V_{CC}$ during erase, N-channel MOS preset transistor 104 of FIG. 2A is no longer needed. During erase both the source and drain of n-channel MOS switch transistor 116 will pre-charge to the $V_{CC}$ bias of p-well 126.

FIGS. 2A and 2B illustrate the output node comprising the common drain connection of the non-volatile n-channel MOS memory transistor 92 and the p-channel MOS pullup transistor 94 connected to drive the gate of a volatile n-channel MOS switch transistor 96. Persons of ordinary skill in the art will appreciate that the output node could also be driving the input of a look-up table (LUT), or a multiplexer.

The volatile p-channel MOS pullup transistor 94 and the volatile n-channel MOS switch 96 (or its equivalents as disclosed herein) are fabricated as low-voltage devices. These volatile transistors are protected from high program and erase voltages applied to the non-volatile transistor because the structure is fabricated such that the n-well in which the p-channel MOS pullup transistor is formed isolates the non-volatile n-channel MOS transistor from the switching elements and the rest of the logic.

The p-channel MOS pullup transistor acts as both an isolation device and a select device. This scheme allows the use of Fowler-Nordheim tunneling as an erase mechanism on the n-channel non-volatile memory transistor with the voltage being split between the gate and the well of that transistor. For negative erase potentials, the well voltage of the non-volatile n-channel MOS memory transistor will be transferred to internal logic if the well of the n-channel non-volatile memory transistor is not isolated from the switch element.

Figure 3A:
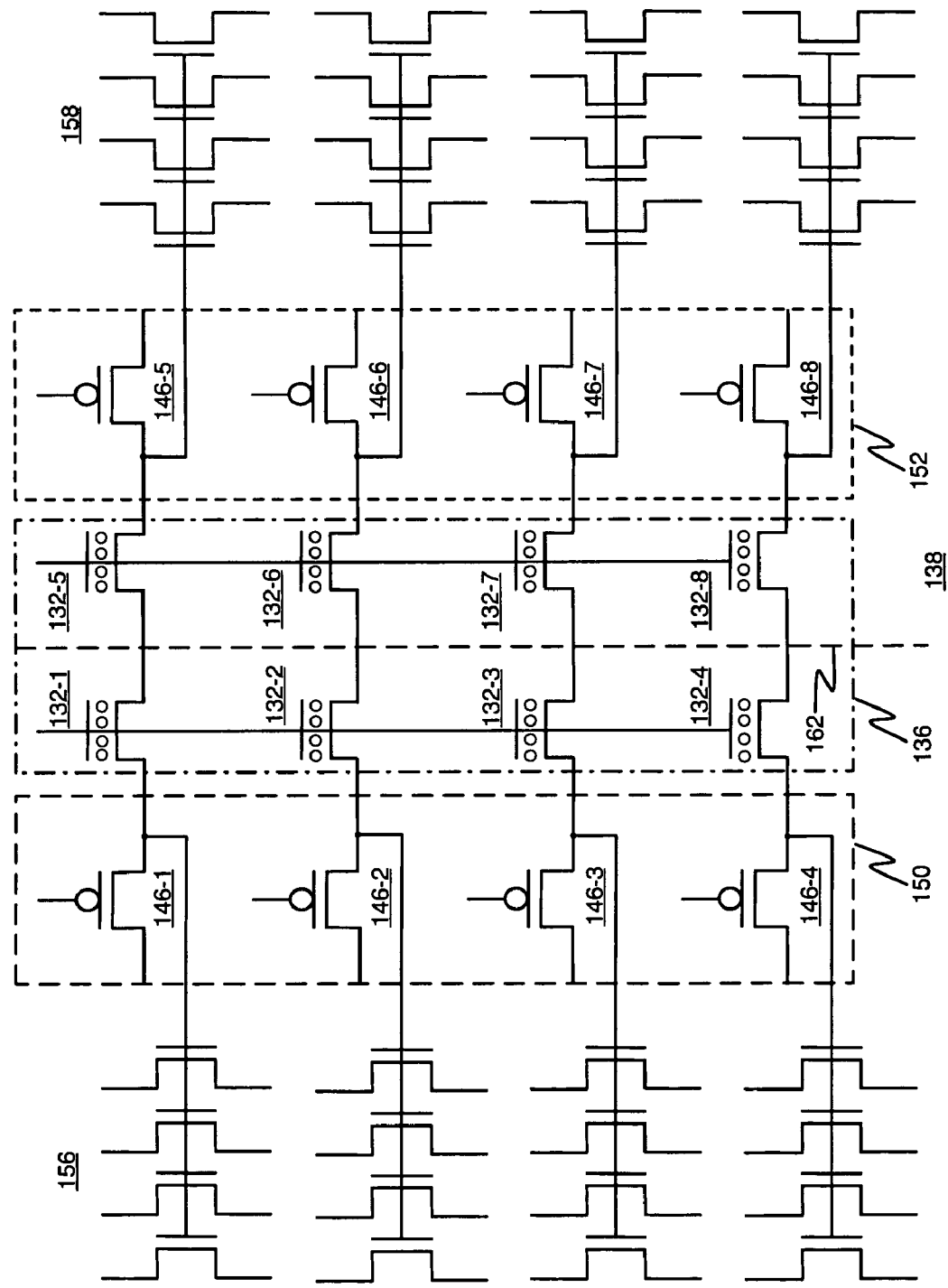
FIG. 3A is a schematic diagram imposed upon a top view of an illustrative layout for an array of memory cells according to the present invention, showing the structural aspects of an array fabricated according to the present invention.
Figure 3B:
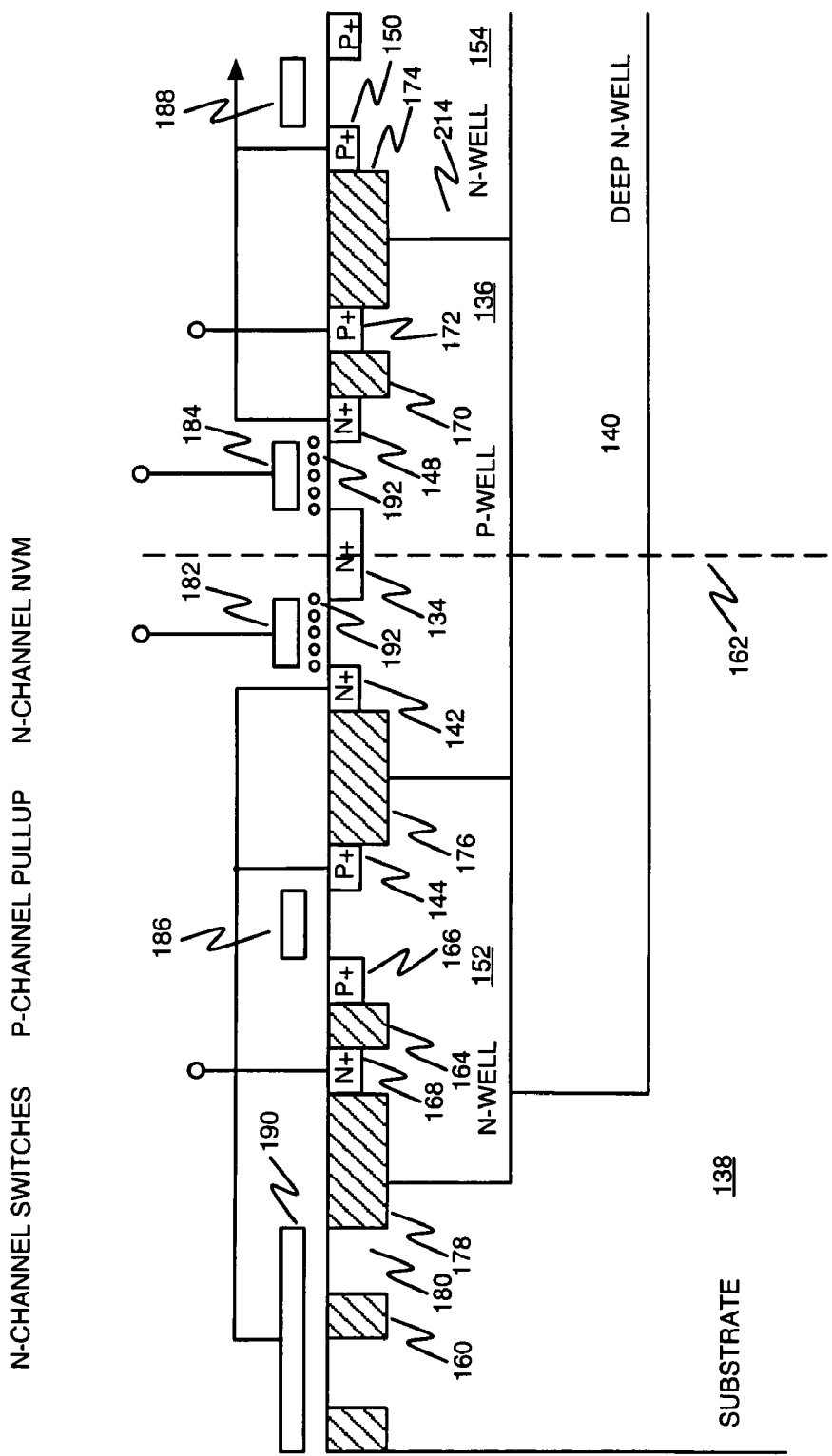
FIG. 3B is a cross sectional view of the left side and a portion of the right side of the layout of FIG. 3A.

In accordance with one aspect of the present invention illustrated in FIGS. 3A and 3B, the n-well of the non-volatile p-channel pullup transistor isolates the p-well of the non-volatile transistor from the p-well of the n-channel MOS switch transistor. This will protect the input and output buffers coupled to the n-channel MOS switch transistor from the negative erase potentials.

FIG. 3A is a schematic diagram of an illustrative layout for an array 130 of memory cells according to the present invention, showing the structural aspects of an array fabricated according to the present invention. FIG. 3B is a cross sectional view of the complete left side of one row of devices in the layout of FIG. 3A and a portion of its right side including the non-volatile n-channel MOS memory transistor and the p-channel MOS pullup transistor. As will be appreciated by persons of ordinary skill in the art, the complete right side of the layout of FIG. 3B will be a mirror image of the complete left side of the layout that is depicted in the figure. Skilled persons in the art will also appreciate that, while the array of FIGS. 3A and 3B is disclosed with reference to an exemplary and illustrative embodiment employing nano-crystal non-volatile memory transistors, other embodiments using non-volatile memory transistors fabricated using other non-volatile technologies, such as floating gate (sometimes referred to as flash or EEPROM), SONOS, silicon nano-crystal, etc., are contemplated as being within the scope of the invention.

As may be seen from an examination of FIG. 3A, four rows of mirrored cells are shown. At the center of FIG. 3A, four pairs of non-volatile n-channel MOS memory transistors 132-1 through 132-8 are shown. Each pair (i.e., 132-1 and 132-2; 132-3 and 132-4; 132-5 and 132-6; and 132-7 and 132-8) shares a common source diffusion (shown as 134 in FIG. 3B). All of the non-volatile n-channel MOS memory transistors 132-1 through 132-8 are disposed in a p-well region 136 which may be, for example, formed to a depth of about 1 micron. As may be seen from an examination of FIG. 3B, p-well region 136 is disposed on substrate 138 over deep n-well region 140 (FIG. 3B), which may also be, for example, formed to a depth of about 1 micron. Deep n-well 140 completely isolates the well of the non-volatile memory device from the wells of the switch and logic devices to protect them from the high programming and erase voltages. The gates of all of the leftmost non-volatile n-channel MOS memory transistors 132-1, 132-3, 132-5 and 132-7 are connected together and the gates of all of the rightmost non-volatile n-channel MOS memory transistors 132-2, 132-4, 132-6 and 132-8 are connected together.

The drain (reference numeral 142 in FIG. 3B) of the leftmost non-volatile n-channel MOS memory transistor (132-1, 132-3, 132-5 and 132-7) in each pair is connected to the drain (reference numeral 144 in FIG. 3B) of one of the p-channel MOS pullup transistors 146-1, 146-2, 146-3 and 146-4). Similarly, the drain (reference numeral 148 in FIG. 3B) of the rightmost non-volatile n-channel MOS memory transistor (132-2, 132-4, 132-6 and 132-8) in each pair is connected to the drain (reference numeral 150 in FIG. 3B) of one of the p-channel MOS pullup transistors 146-5, 146-6, 146-7 and 146-8). P-channel MOS pullup transistors 146-1, 146-2, 146-3 and 146-4 are disposed in an n-well region 152 and p-channel MOS pullup transistors 146-5, 146-6, 146-7 and 146-8 are disposed in an n-well region 154. As may be seen from FIG. 3B, n-well regions 152 and 154 are formed over deep n-well region 140. Persons of ordinary skill in the art will observe that FIG. 3A shows that n-well regions 152 and 154 are spaced apart from p-well region 136. Such skilled persons will understand that the design rules for such spacing in particular processes utilizing particular device geometries are known and are beyond the scope of the present invention.

On the left side of the array, the common drain node of each non-volatile n-channel MOS memory transistor (132-1, 132-3, 132-5 and 132-7) and its p-channel MOS pullup transistor (146-1, 146-2, 146-3, and 146-4) is coupled to the gates of several n-channel MOS switching transistors (groups of four are shown at reference numeral 156). Similarly, on the right side of the array, the common drain node of each non-volatile n-channel MOS memory transistor (132-2, 132-4, 132-6 and 132-8) and its p-channel MOS pullup transistor is coupled to the gates of several n-channel MOS switching transistors (groups of four are shown at reference numeral 158). The n-channel MOS switching transistors 156 and 158 are all low-voltage devices and may be formed in the p-type substrate 136 on which the integrated circuit is fabricated, or may be formed in separate p-well regions. Persons of ordinary skill in the art will recognize that FIG. 3B shows a view of two of the n-channel MOS switch transistors 156 along their channel lengths, separated by field oxide region 160 so that source and drain regions of those transistors are not shown in the figure.

Persons of ordinary skill in the art will understand that the diffusions of n-channel MOS switching transistors 156 and 158 may be configured for operation at about 1.5 volts or less. Such skilled persons will also understand that the gate oxides of n-channel MOS switching transistors 156 and 158 are fabricated for operation at about 3.3 volts in order to withstand the potentials that may be encountered during programming.

As may be seen from an examination of both FIGS. 3A and 3B, the outer edges of the deep n-well region 140 are recessed inward from the edges of n-well regions 152 and 154 in order to isolate from the other transistors such as buffer transistors and provide spacing to nearby n-wells. It can also be aligned (not recessed).

The separate-well isolation aspect of the array of the present invention may best be seen with reference to FIG. 3B. A center line 162, depicted in both FIGS. 3A and 3B, shows the axis of symmetry of the mirror cells of FIGS. 3A and 3B. This axis runs through the center of diffusion region 134, the common sources for each pair of non-volatile n-channel MOS memory transistors.

N-well 152 separates p-well 136 from the substrate (or other p-well in which transistors 156 are formed). Similarly, although not shown in FIG. 3B, n-well 154 separates p-well 136 from the substrate (or other p-well in which transistors 158 are formed). As also shown in FIG. 3B, field oxide region 164 separates the source 166 of one of the left p-channel MOS pullup transistors from the n-well contact 168. Similarly, field oxide region 170 separates the drain 148 of one of the right non-volatile n-channel MOS memory transistors from the p-well contact 172. Field oxide region 174 separates contact region 170 from the drain 150 of one of the rightmost p-channel MOS pullup transistors. Field oxide region 176 separates the drain 142 of one of the left non-volatile n-channel MOS memory transistors from the drain 144 of one of the left p-channel MOS pullup transistors. Field oxide region 178 separates the n-well contact 168 from the channel 180 of one of the n-channel MOS switch transistors 156.

Finally, FIG. 3B shows the common gates of the left and right non-volatile n-channel MOS memory transistors at reference numeral 182 and 184, respectively, and the gates of a left and a right p-channel MOS pullup transistor at reference numeral 186 and 188, respectively, and the common gate of the left n-channel MOS switching transistors 156, at reference numeral 190. The nano-crystal charge-trapping regions of each of the pair of the non-volatile n-channel MOS memory transistors are shown as small circles 192.

Referring now to FIGS. 4A through 4D, schematic diagrams show several non-volatile memory cells according to the present invention in which a non-volatile MOS pullup transistor is used in conjunction with a volatile pulldown transistor. The combination of the non-volatile device and the volatile device are used to drive a switch.

Figure 4A:
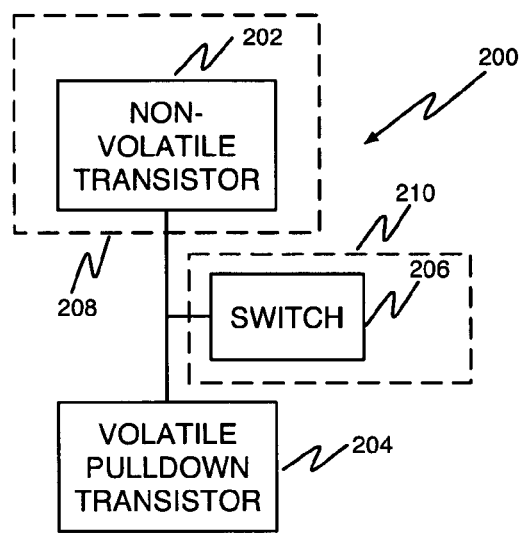
FIGS. 4A through 4D are schematic diagrams illustrating various non-volatile programmable memory cells using p-channel non-volatile MOS transistors, volatile n-channel MOS pulldown transistors and n-channel transistors as switches.

Referring now to FIG. 4A, memory cell 200 is shown. Reference numeral 202 represents a non-volatile pullup device, reference numeral 204 represents a volatile pulldown device. Reference numeral 206 represents a switch controlled by the devices 202 and 204 that may be used to control circuitry or selectively make interconnects. As presently contemplated, switch 206 may comprise a single transistor, an inverter, a buffer (two inverters in series) or other device. Switch 206 may even be itself the input of a multiplexer. Non-volatile pullup device 202 is disposed in a first well represented by dashed box 208. Switch 206 is disposed in a second well represented by dashed box 210 electrically isolated from first well 208.

Figure 4B:
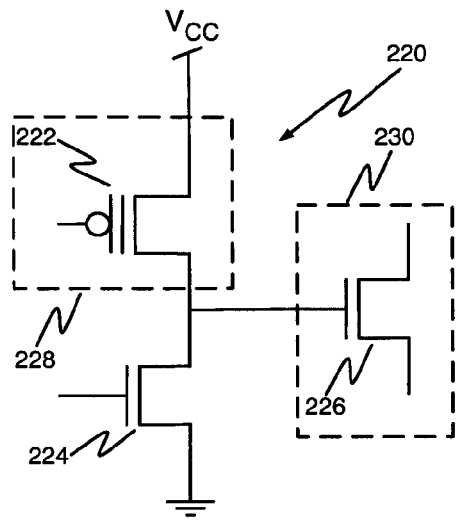

Referring now to FIG. 4B, memory cell 220 is shown. P-channel floating-gate MOS transistor 222 has its source coupled to the supply potential $V_{CC}$ and its drain coupled to the drain of n-channel MOS pulldown transistor 224. The source of n-channel pulldown transistor 224 is coupled to ground. The common drain connection of transistors 222 and 224 is coupled to the gate of n-channel switch transistor 226. The source and drain of n-channel MOS switch transistor 226 may be connected to provide programmable functions as will be disclosed herein. P-channel floating-gate MOS transistor 222 is disposed in a first well represented by dashed box 228. N-channel MOS switch transistor 226 is disposed in a second well represented by dashed box 230 isolated from first well 228.

P-channel floating-gate MOS transistor 222 may be an EEPROM transistor or a flash transistor as is known in the art. Its gate may be coupled to a circuit 2 to provide the proper voltages for programming and erasing the memory cell 220, and for using the memory cell 220 during normal circuit operation. The particular potentials used for these operations will vary as a function of the technology employed and the process geometry.

Figure 4C:
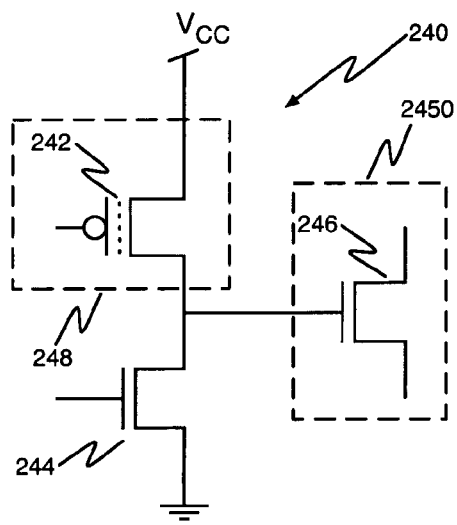

Referring now to FIG. 4C, memory cell 240 is shown. P-channel floating charge-trap MOS transistor 242 has its source coupled to $V_{CC}$ and its drain coupled to the drain of n-channel MOS pulldown transistor 244. The source of n-channel pulldown transistor 244 is coupled to the supply potential ground. The common drain connection of transistors 242 and 244 is coupled to the gate of n-channel switch transistor 246. The source and drain of n-channel MOS switch transistor 246 may be connected to provide programmable functions as will be disclosed herein. P-channel floating charge-trap MOS transistor 242 is disposed in a first well represented by dashed box 248. N-channel MOS switch transistor 246 is disposed in a second well represented by dashed box 250 isolated from first well 248.

P-channel floating charge-trap MOS transistor 242 may be fabricated using MNOS, SONOS, and other charge-trapping structures. Its gate may be coupled to a circuit to provide the proper voltages for programming and erasing the memory cell 240, and for using the memory cell 240 during normal circuit operation. The particular potentials used for these operations will vary as a function of the technology employed and the process geometry. As an example, where a high-voltage n-channel MOS pulldown transistor 244 is used, the following illustrative potentials may be encountered:

| | N-Channel | | | P-Channel | | |
|---|---|---|---|---|---|---|
| | $V_G$ | $V_D$ | $V_S$ | $V_G$ | $V_D$ | $V_S$ |
| Program | 0 V | 0 V | float | 10 V | float | −5.5 V |
| Erase | 8.5 V | 8.5 V | float | −8.5 V | float | 8.5 V |
| Normal Operation | 0.2 V | | 0 V | 2.5 V | | 4 V |

Discrete charge trapping devices are less vulnerable to tunnel oxide defects than are floating gate devices and their use may be preferable because of this characteristic.

Figure 4D:
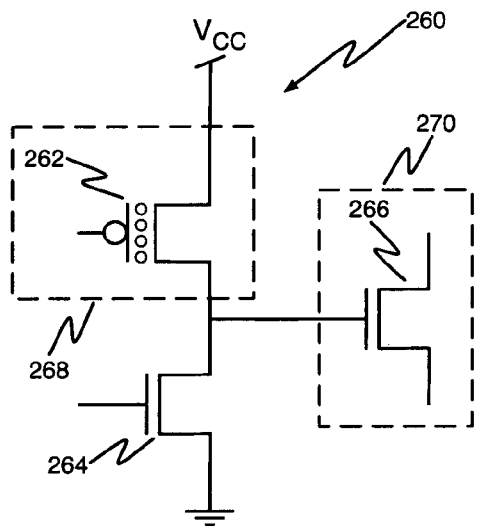

Referring now to FIG. 4D, memory cell 260 is shown. P-channel nano-crystal MOS transistor 262 has its source coupled to $V_{CC}$ and its drain coupled to the drain of n-channel MOS pulldown transistor 264. The source of n-channel pullup transistor 264 is coupled to the supply potential ground. The common drain connection of transistors 262 and 264 is coupled to the gate of n-channel switch transistor 266. The source and drain of n-channel MOS switch transistor 266 may be connected to provide programmable functions as will be disclosed herein.

P-channel nano-crystal MOS transistor 262 may be fabricated using known nano-crystal processing techniques. Its gate may be coupled to a circuit to provide the proper voltages for programming and erasing the memory cell 260, and for using the memory cell 260 during normal circuit operation. The particular potentials used for these operations will vary as a function of the technology employed and the process geometry.

In all of the cells shown in FIGS. 4A through 4D, the volatile p-channel MOS transistor charges the common drain connection of the p-channel and n-channel transistors, and thus the gate of the switching transistor, to $V_{CC}$ depending on whether or not the non-volatile transistor is programmed.

As with the embodiments of FIGS. 1A through 1D, persons of ordinary skill in the art will recognize that the gate oxide layers of the switch devices used in the various embodiments of the present invention shown in FIGS. 4A through 4D must be able to withstand the potentials that will be encountered during programming and erasing of the memory cells. The programming and erase potentials used will of course depend on the type of non-volatile technology used as well as the device geometries.

In the embodiments shown in FIGS. 4A through 4D, the non-volatile pullup device is disposed in an n-well. In each case, the pulldown device and the switch device may be located in the same p-well. Because the switch device is located in a p-well separated from the n-well in which the non-volatile pullup device is located, the switch device may be isolated from the programming and erase potentials that are applied to the non-volatile device. Therefore, low-voltage switch devices may be used, subject to gate-oxide thickness issues as disclosed herein.

In some embodiments, the non-volatile memory transistors are programmed using hot carrier injection programming, which is a current density dependent programming mechanism. For example, a nano-crystal device may require 100 microamps for every 0.18 microns of device width. A large programming current requires a larger volatile pullup (or pulldown) device. As memory cell sizes shrink, the cells have an increasingly limited $I_{PP}$. This may begin to become an issue for cells that use HCI (Hot Carrier electron Injection) for programming.

Figure 5:
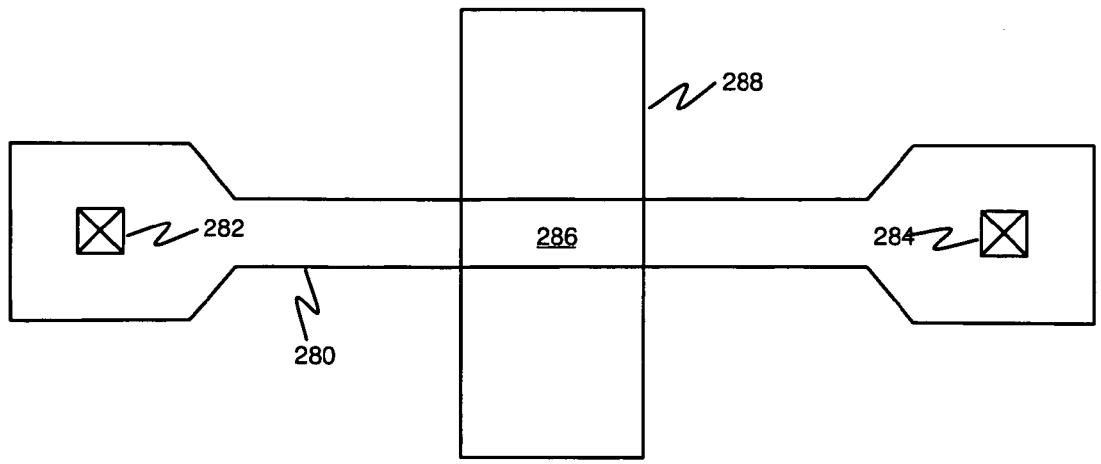
FIG. 5 is a top view of a portion of a layout diagram illustrating one technique for increasing the programming current in memory cells that are programmed using hot carrier injection programming.

Referring now to FIG. 5, a top view is shown of a portion of a layout diagram illustrating a technique for increasing the programming current in memory cells that are programmed using hot carrier injection programming. In order to reduce the size of the non-volatile pull-up device, but maintain the required current density, the channel width of the non-volatile device may be reduced in a relevant area. According to this aspect of the present invention, the active channel area is narrowed down or "dogboned" from the non-volatile contact to a smaller width at the nano-crystal channel. Thus, as shown in FIG. 5, diffused region 280 is disposed between contacts 282 and 284. The channel region 286 disposed below gate 288 is narrowed down or "dogboned" to allow a greater current density during programming. In a typical nano-crystal transistor having a nominal channel width of about 0.18 micron, the width can be narrowed to about 0.12 micron to achieve the satisfactory current density increase for the purposes of the present invention.

Figure 6:
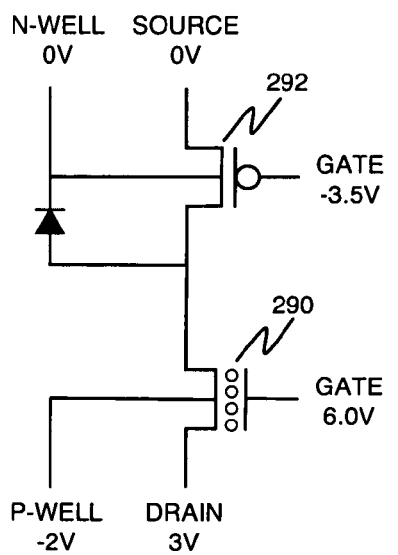
FIG. 6 is a schematic diagram illustrating another technique for increasing the programming current in memory cells that are programmed using hot carrier injection programming.

FIG. 6 is a schematic diagram illustrating another technique for increasing the programming current in memory cells that are programmed using hot carrier injection programming. As shown in FIG. 6, nano-crystal n-channel MOS memory cell transistor 290 is connected in series with p-channel MOS pullup transistor 292. FIG. 6 shows illustrative bias-voltage conditions that may be used during programming of nano-crystal n-channel MOS memory cell transistor 290 in accordance with the present invention.

By forward biasing the drain of the p-channel MOS pullup transistor 292 into the n-well in which it is formed, the value of $I_{PP}$ can be further increased beyond just passing current thru its channel. This aids in the HCI programming time and reduces the burden of increasing the bias on the p-channel MOS pullup transistor 292 or increasing its size in order to accommodate a higher $I_{PP}$.

In the memory cells disclosed herein, if a radiation particle strikes the node containing the gate of the n-channel MOS switch transistor, the node may be discharged from $V_{cc}$ to ground or to the bias of the substrate or p-well containing the device (which is normally ground). This causes the switch(es) to turn off. It will take the p-channel pullup transistor about 1-10 microseconds to charge this node back up to operating voltage, during which time the FPGA will not function correctly.

Figure 7:
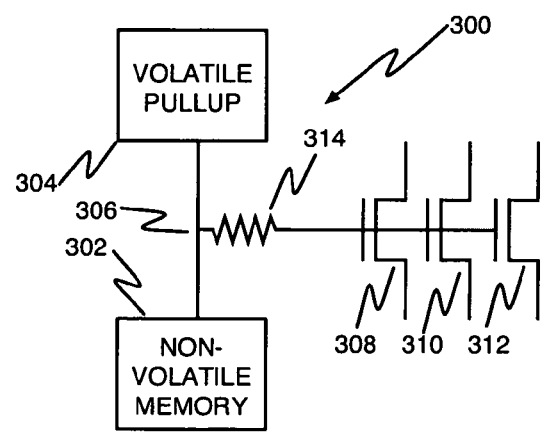
FIG. 7 is a schematic diagram illustrating a radiation-tolerant version of a memory cell according to the present invention.

FIG. 7 is a schematic diagram illustrating a radiation-tolerant version of a memory cell according to the present invention that avoids this problem. As in the memory cells disclosed with reference to FIGS. 1A through 1D, the radiation-tolerant memory cell 300 of FIG. 7 includes a non-volatile memory transistor 302 in series with a volatile pullup transistor 304. The common drain node 306 of the two transistors is seen driving the gates of three n-channel MOS switching transistors 308, 310, and 312 through resistor 314.

By adding a resistor 314 of proper value between common drain node 306 and the gate of the first switch 308 to which node 306 is connected, the RC time constant of the circuit may be modified so that the RC time constant is greater than the time it takes the volatile p-channel transistor to recharge node 306 (the recovery time of the cell). For example, if the recovery time is 1 microsecond and the gate capacitance is $1\times10^{-14}$ Farads, then the resistance needs to be greater than 100 MegaOhms ($R=T/C=10^{-6}/10^{-14}=10^{8}$). This type of resistor may be constructed of undoped or very lightly doped polysilicon, as well known in the art.

Persons of ordinary skill in the art will appreciate that the solution shown in FIG. 5 will work equally well with the memory cells shown in FIGS. 4A through 4D using p-channel non-volatile MOS memory transistors and n-channel pulldown transistors.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile programmable memory cell formed in a semiconductor substrate of a first conductivity type and comprising:
   a non-volatile MOS transistor of a second conductivity type formed in a first semiconductor region of the first conductivity type and coupled between a first power supply potential and an output node;
   a volatile MOS transistor of the first conductivity type formed in a semiconductor region of the second conductivity type and coupled between the output node and a second power supply potential; and
   a volatile MOS switch transistor of the second conductivity type formed in a second semiconductor region of the first conductivity type and coupled to the output node;
   wherein the first and second semiconductor regions of the first conductivity type are electrically isolated from one another.

2. The non-volatile programmable memory cell of claim 1 wherein said first semiconductor region of the first conductivity type is a well region of the first conductivity type formed within a first well region of the second conductivity type and the second semiconductor region of the first conductivity type is the semiconductor substrate.

3. The non-volatile programmable memory cell of claim 2 wherein the volatile MOS transistor of the first conductivity type is formed in the first well region of the second conductivity type.

4. The non-volatile programmable memory cell of claim 1 wherein said first semiconductor region of the first conductivity type is a first well region of the first conductivity type formed within a well region of the second conductivity type and the second semiconductor region of the first conductivity type is a second well region of the first conductivity type isolated from the first well region of the first conductivity type.

5. The non-volatile programmable memory cell of claim 4 wherein the volatile MOS transistor of the first conductivity type is formed in the first well region of the second conductivity type.

6. The non-volatile programmable memory cell of claim 1 wherein said non-volatile MOS transistor is a floating gate transistor.

7. The non-volatile programmable memory cell of claim 1 wherein said non-volatile MOS transistor is a flash transistor.

8. The non-volatile programmable memory cell of claim 1 wherein said non-volatile MOS transistor is a floating charge-trapping transistor.

9. The non-volatile programmable memory cell of claim 1 wherein said non-volatile MOS transistor is a nano-crystal transistor.

10. The non-volatile programmable memory cell of claim 1 wherein said first conductivity type is N and said second conductivity type is P.

11. The non-volatile programmable memory cell of claim 1 wherein said first conductivity type is P and said second conductivity type is N.

12. The non-volatile programmable memory cell of claim 1 wherein said first conductivity type is N, and said second conductivity type is P.

13. The non-volatile programmable memory cell of claim 1 wherein said first conductivity type is P, said second conductivity type is N.

14. The non-volatile programmable memory cell of claim 1 further including at least one additional volatile MOS switch transistor of the second conductivity type formed in the second semiconductor region of the first conductivity type and coupled to the output node.

15. A non-volatile programmable memory cell formed in a p-type semiconductor substrate and comprising:
   a non-volatile n-channel MOS transistor formed in a first p-type semiconductor region and coupled between a first power supply potential and an output node;
   a volatile p-channel MOS transistor formed in an n-type semiconductor region and coupled between the output node and a second power supply potential; and
   a volatile n-channel MOS switch transistor formed in a second p-type semiconductor region and coupled to the output node;
   wherein the first and second p-type semiconductor regions are electrically isolated from one another.

16. The non-volatile programmable memory cell of claim 15 wherein:
   the n-type semiconductor region is an n-well disposed in the semiconductor substrate;
   the first p-type region is a p-well disposed within the n-well; and
   the second p-type semiconductor region is the substrate.

17. The non-volatile programmable memory cell of claim 15 wherein:
   the n-type semiconductor region is an n-well disposed in the semiconductor substrate;
   the first p-type region is a first p-well disposed within the n-well; and
   the second p-type semiconductor region is a second p-well disposed in the substrate and isolated from the first p-well.

18. The non-volatile programmable memory cell of claim 15 further including at least one additional volatile n-channel MOS switch transistor formed in the second p-type semiconductor region and coupled to the output node.

* * * * *